(12) United States Patent
Endo

(10) Patent No.: US 7,948,331 B2
(45) Date of Patent: May 24, 2011

(54) THIN FILM BALUN

(75) Inventor: Makoto Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 184 days.

(21) Appl. No.: 12/382,395

(22) Filed: Mar. 16, 2009

(65) Prior Publication Data
US 2009/0237176 A1 Sep. 24, 2009

(30) Foreign Application Priority Data

Mar. 18, 2008 (JP) ................................. 2008-069119

(51) Int. Cl.
*H03H 7/42* (2006.01)
*H01P 3/08* (2006.01)
(52) U.S. Cl. ......................................... 333/25; 333/246
(58) Field of Classification Search .................... 333/25, 333/26, 246
See application file for complete search history.

(56) References Cited

U.S. PATENT DOCUMENTS

| | | | |
|---|---|---|---|
| 6,396,362 B1 * | 5/2002 | Mourant et al. | 333/25 |
| 6,768,410 B1 | 7/2004 | Yazaki et al. | |
| 7,629,860 B2 * | 12/2009 | Liu et al. | 333/25 |
| 2010/0045396 A1 * | 2/2010 | Endo | 333/25 |
| 2010/0045401 A1 * | 2/2010 | Endo | 333/26 |
| 2010/0164643 A1 * | 7/2010 | Endo | 333/26 |
| 2010/0164644 A1 * | 7/2010 | Endo | 333/26 |
| 2011/0012690 A1 * | 1/2011 | Endo | 333/25 |

FOREIGN PATENT DOCUMENTS

JP 3780414 5/2006

* cited by examiner

*Primary Examiner* — Dean O Takaoka
(74) *Attorney, Agent, or Firm* — Oliff & Berridge PLC

(57) ABSTRACT

There is provided a thin film balun which, while incorporating a capacitor used to supply a DC bias, allows improvement of various required characteristics. A thin film balun according to the present embodiment includes: an unbalanced transmission line which includes two first coils; a balanced transmission line which includes two second coils and which magnetically couples with the unbalanced transmission line; a capacitor having one end connected to the balanced transmission line; and a ground terminal connected to the other end of the capacitor. The capacitor is disposed to have a region which does not overlap a part of coil openings defined by the first coils and the second coils.

6 Claims, 9 Drawing Sheets

THIN FILM BALUN

BACKGROUND OF THE INVENTION

1. Field of the Invention

The present invention relates to a balun that performs unbalanced-to-balanced signal conversion, and more particularly to a thin film balun formed by a thin film process which is advantageous for miniaturization and thickness reduction.

2. Description of the Related Art

Radio communication apparatuses include various high frequency elements such as antenna, filter, RF switch, power amplifier, RF-IC and balun. Here, resonant elements such as antenna and filter handle unbalanced signals relative to the ground potential; however, RF-IC, which produces or processes high frequency signals, handles balanced signals. Thus, in connecting the two types of elements, a balun is used which functions as an unbalanced-to-balanced signal converter.

Sometimes a balanced signal needs to be amplified by applying a bias to a balun used in mobile communication equipment such as mobile-phone and wireless LAN. In this case, between the balanced transmission line of the balun and the ground terminal, a capacitor must be connected in series which has a capacitance which allows the intended frequency signal to flow to GND, so that the DC component and the intended frequency component are separated.

As a balun having such function, Japanese Patent No. 3780414 discloses a laminated balun which has a capacitor arranged between a balanced transmission line and GND terminal of the balun. This laminated balun is formed by using LTCC (Low Temperature Co-fired Ceramics) technique, and the capacitor is formed over the whole area.

To meet the recent demands for miniaturization and thickness reduction of electronic devices, the present inventor has made a diligent study on characteristics of a balun including the related art bias supply capacitor. As a result, it was found that, in a thin film balun formed by a thin film process, the related art bias supply capacitor affects the characteristics of the balun. It is estimated that this is caused by a structural factor that thin film baluns have a short interlaminar distance between the capacitor and balanced transmission line, compared to laminated baluns. However, it became clear that, as long as the structure of the related art laminated balun is used, various characteristics required by thin film baluns cannot be further improved to a satisfactory level.

To address the above problem, the present invention has been devised, and its object is to provide a thin film balun which, while incorporating a capacitor used to supply a DC bias, allow improvement in various required characteristics.

SUMMARY OF THE INVENTION

To achieve the above object, a thin film balun according to the present invention includes: an unbalanced transmission line which includes a pair of first coil sections; a balanced transmission line which includes a pair of second coil sections and which magnetically couples with the unbalanced transmission line; a capacitor having one end connected to the balanced transmission line; and a ground terminal connected to the other end of the capacitor, wherein the capacitor is disposed to have a region which does not overlap a part of a coil opening defined by the first coil section and the second coil section.

With this structure, some points are still not clear with respect to details of operation mechanism by which thin film balun characteristics are improved which include transmission characteristics at the intended frequency and signal balancing (phase and amplitude). However, it is estimated that, since the capacitor is disposed to have a region which does not overlap a part of the coil opening, the effects on magnetic coupling of the unbalanced transmission line and balanced transmission line are reduced, compared to when the capacitor is disposed to overlap the whole coil opening, so that the characteristics of the thin film balun are improved. Here, the overlapping of the capacitor with the coil section and coil opening refers to an overlapping observed as seen from a facing direction of the first coil section and second coil section.

Preferably the capacitor is disposed not to overlap the whole area of the pair of coil openings. Accordingly, it is estimated that, since the magnetic flux passing through the coil opening is not blocked by the capacitor, the effects of the capacitor on the magnetic field are significantly reduced.

The capacitor is disposed to overlap a part of the region above the first coil section and the second coil section. Accordingly, the thin film balun is miniaturized as compared to when the capacitor is disposed outside the coil-shaped balanced transmission line to prevent the capacitor from overlapping the coil opening.

For example, the first coil section and the second coil section each have a corner, and the capacitor is disposed to overlap a part of a region above the corner. When the capacitor is disposed in a region which overlaps the coil-shaped balanced transmission line, also, it is estimated that satisfactory characteristics of thin film balun are provided. In addition, when the capacitor is disposed to overlap at least a part of the corner, wiring is made easier.

For example, the pair of first coil sections are disposed adjacent to each other on the same plane, and the pair of second coil sections are disposed to face the pair of first coil sections, and a pair of coil openings disposed adjacent to each other on a plane are defined by the first coil section and the second coil section. In this case, a region overlapping one coil opening of the pair of coil openings has the same area as a region overlapping the other coil opening of the pair of coil openings. In this way, when the coil openings are disposed adjacent to each other on the plane, it is estimated that, when the areas of the regions overlapping the two coil openings is equalized, the effects on the magnetic field of the two coil-shaped balanced transmission lines are made uniform as compared to when the capacitor overlaps only one coil opening. As a result, the balancing of two balanced signals outputted from the two coil-shaped balanced transmission lines increases.

More preferably, the capacitor is disposed so that the region overlapping one coil opening and the region overlapping the other coil opening are symmetrical with respect to a virtual line which divides the pair of coil openings into the two coil openings. In this way, when the capacitor is disposed so that the regions overlapping the two coil openings are symmetrical, it is estimated that the effects on the magnetic field of the two coil-shaped balanced transmission lines are made uniform as compared to when the regions are simply equalized.

According to the present invention, since the capacitor is disposed so that at least a part of the coil opening is exposed, thin film balun characteristics are improved which include transmission characteristics at the intended frequency and signal balancing (phase and amplitude).

DETAILED DESCRIPTION OF THE PREFERRED EMBODIMENTS

Figure 1:
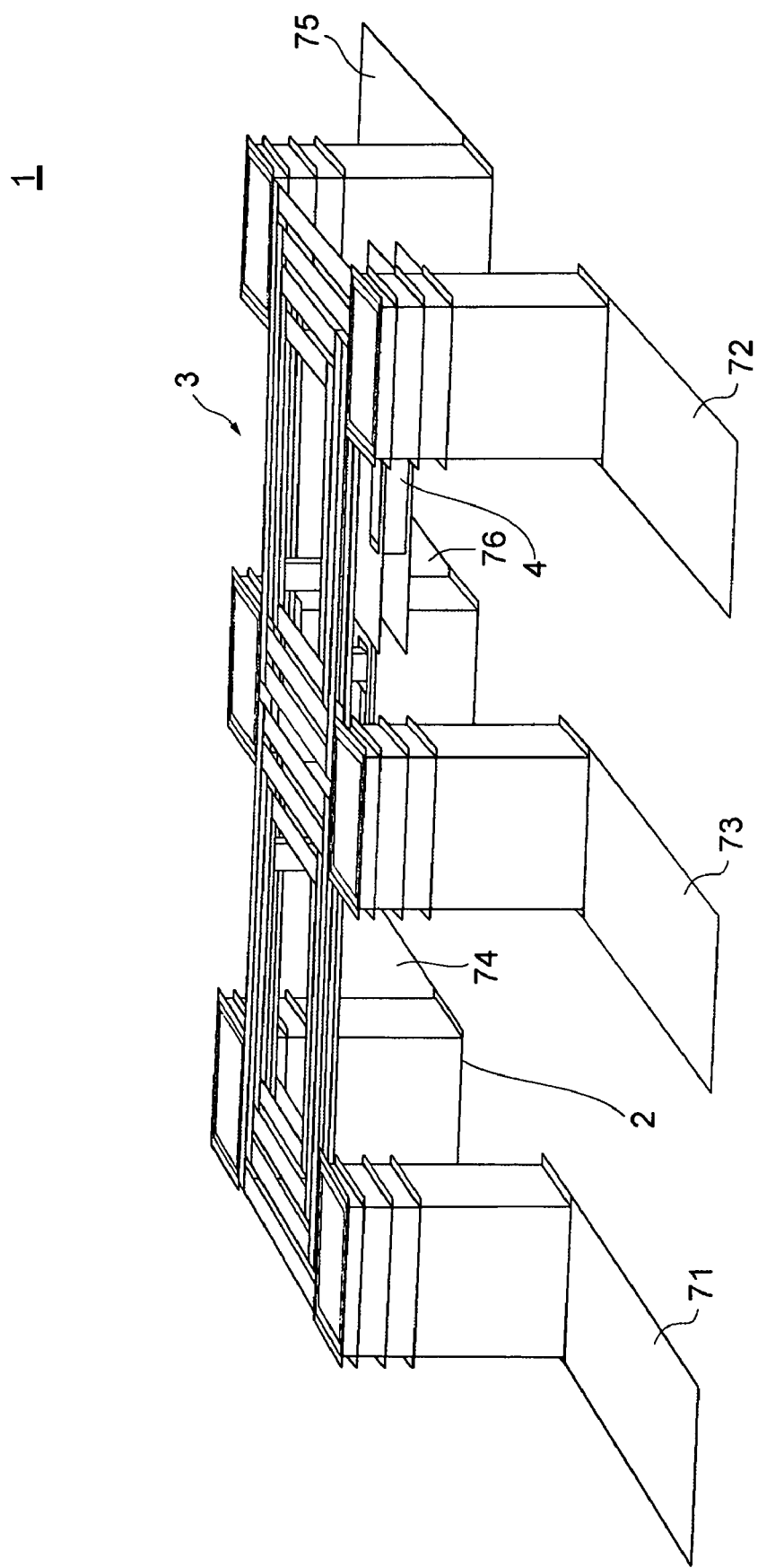
FIG. 1 is a perspective view illustrating a schematic structure of a thin film balun 1 according to the present embodiment.

Embodiments of the present invention will be described below with reference to the drawings. In the drawings, the same reference characters are applied to identical elements, and repeated explanation thereof is omitted. The positional relationship in the up/down/left/right directions is, except if otherwise mentioned, based on the positional relationship illustrated in the drawings. The dimension ratio in the drawings is not limited thereto. The following embodiments are merely exemplary of the present invention, and are not construed to limit the scope of the present invention. Further, many modifications to the embodiments are possible without departing from the gist of the invention.

FIG. 1 is a perspective view illustrating a wiring structure of a thin film balun according to the present embodiment.

The thin film balun 1 includes: an unbalanced transmission line 2 which includes a pair of adjoining coils; a balanced transmission line 3 which includes a pair of coils disposed to face the coils of the unbalanced transmission line 2 and which magnetically couples with the unbalanced transmission line 2; a capacitor 4 having one end connected to the balanced transmission line 3; and a ground terminal 72 connected to the other end of the capacitor 4. The thin film balun 1 further includes, as other terminals, an unbalanced signal terminal 71, DC supply terminal 73, balanced signal terminals 74 and 75, and NC (Non-Connection) terminal 76.

Figure 2:
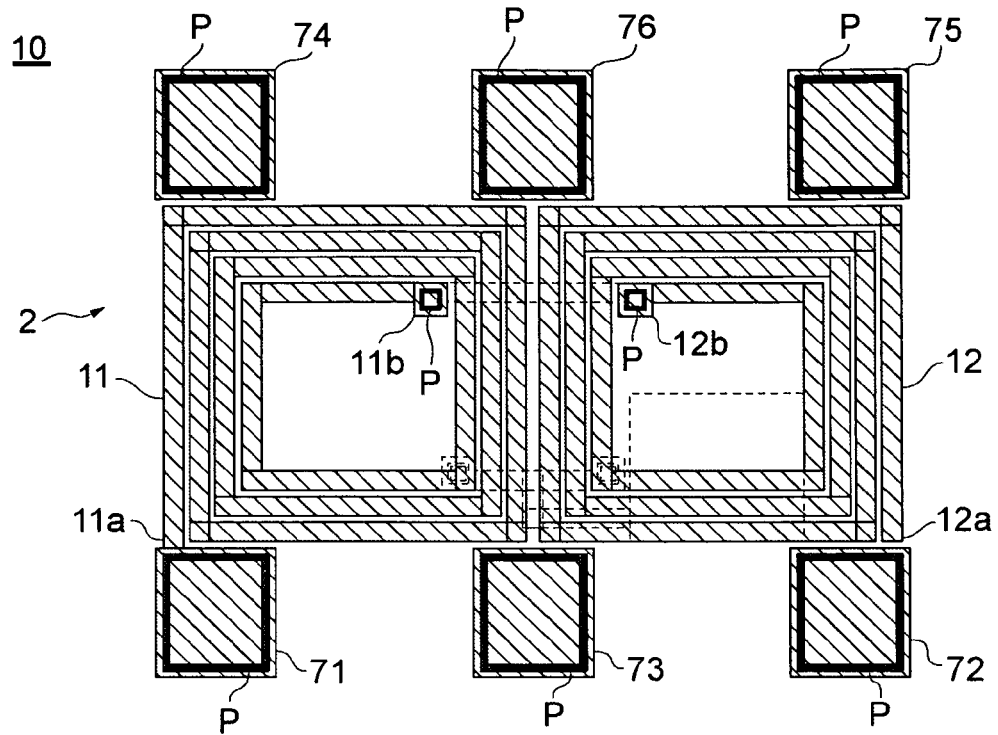
FIG. 2 is a plan view illustrating a first wiring layer 10 of the thin film balun 1.
Figure 3:
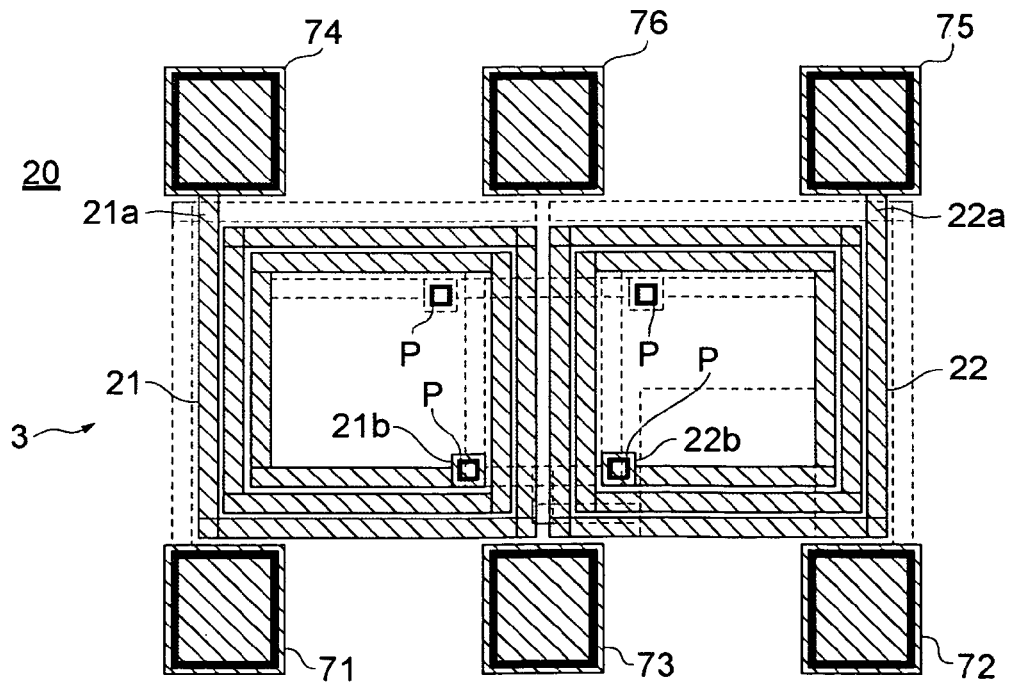
FIG. 3 is a plan view illustrating a second wiring layer 20 of the thin film balun 1.
Figure 4:
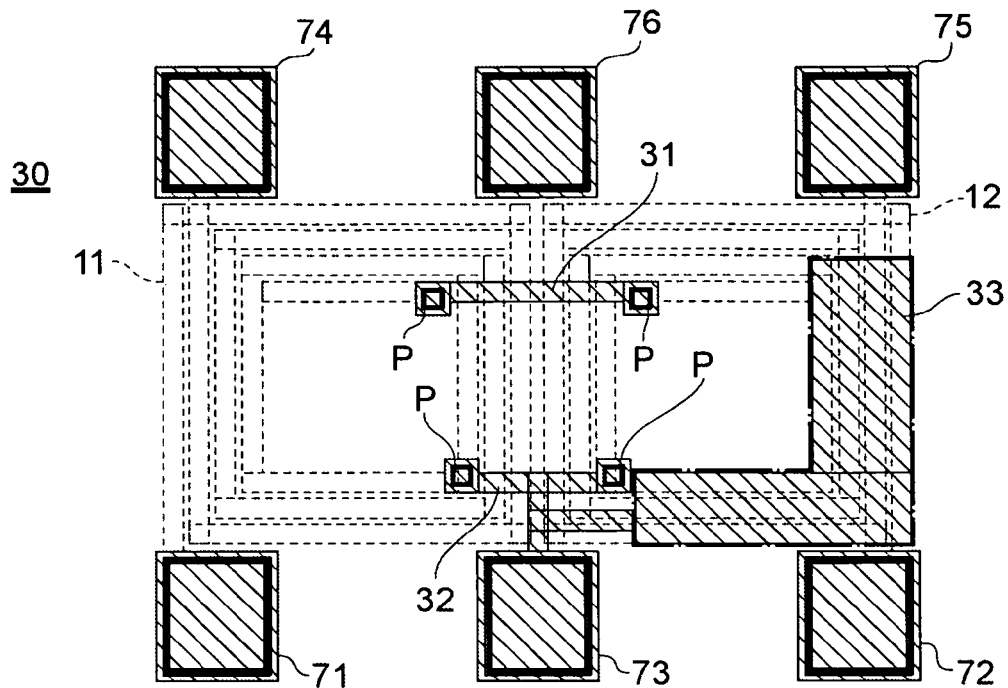
FIG. 4 is a plan view illustrating a third wiring layer 30 of the thin film balun 1.
Figure 5:
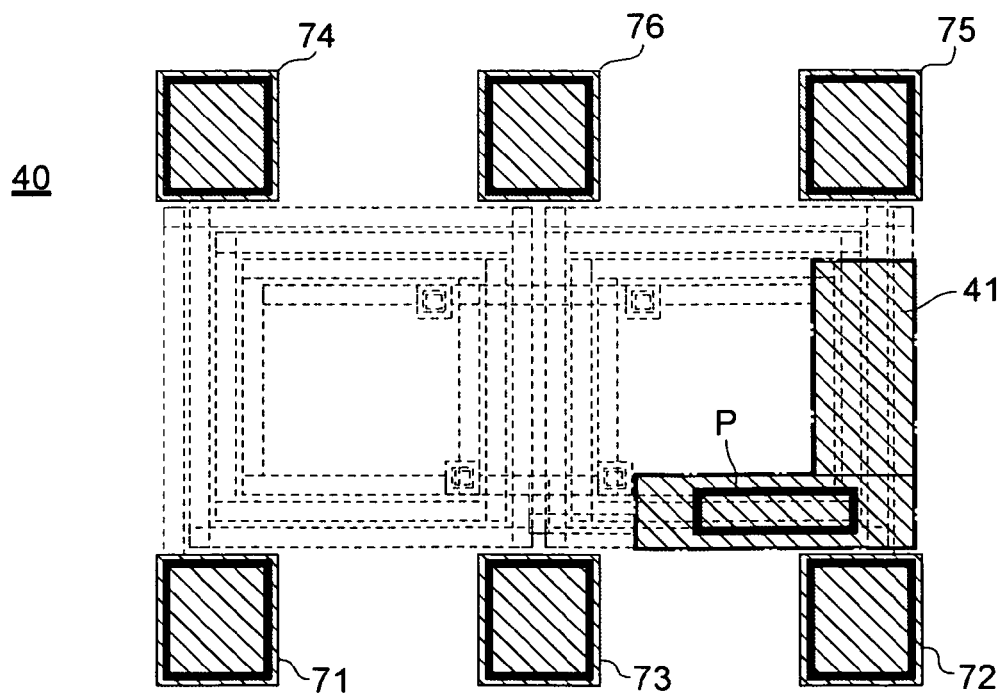
FIG. 5 is a plan view illustrating a fourth wiring layer 40 of the thin film balun 1.
Figure 6:
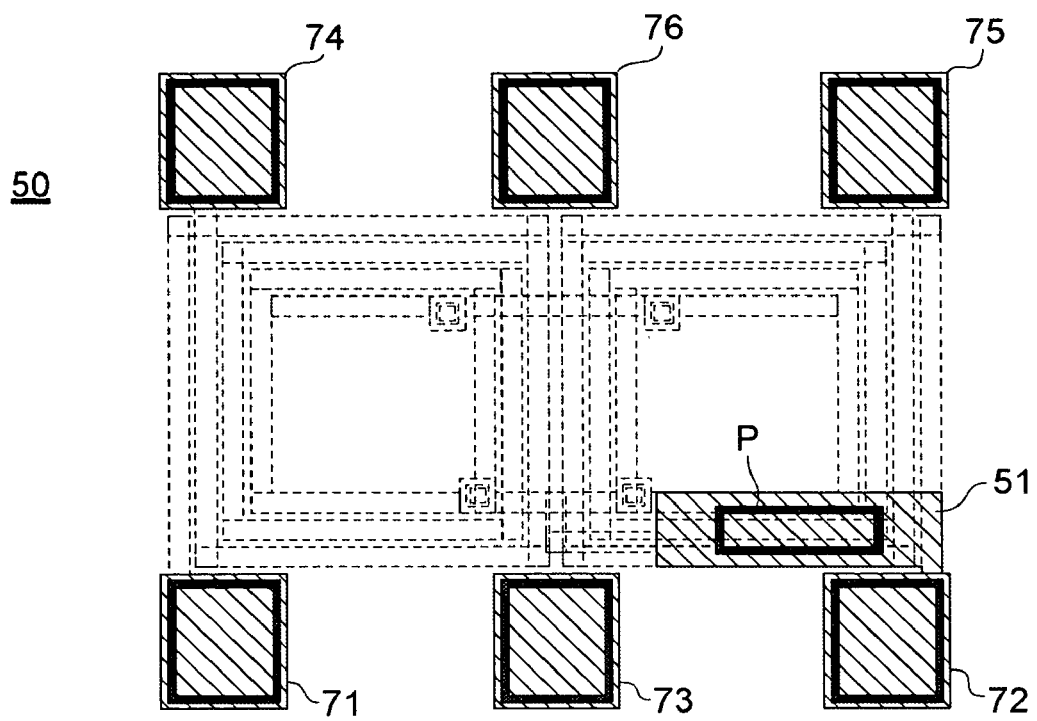
FIG. 6 is a plan view illustrating a fifth wiring layer 50 of the thin film balun 1.
Figure 7:
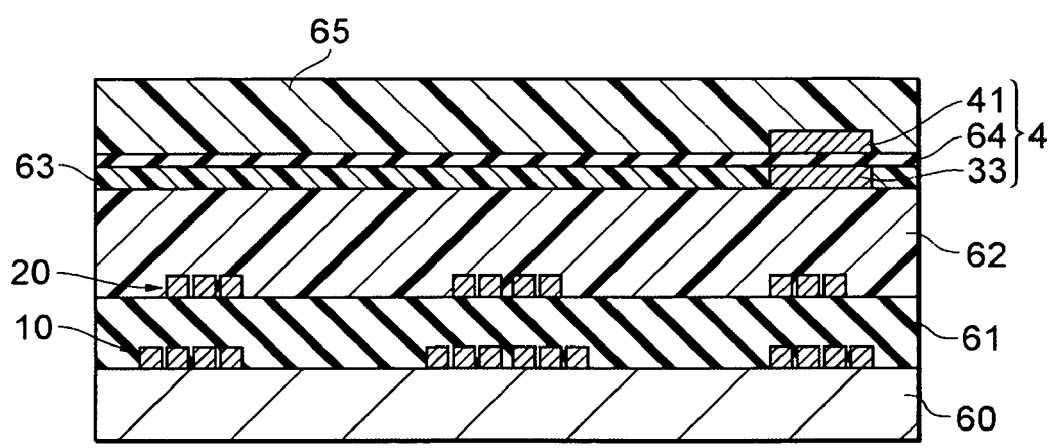
FIG. 7 is a cross-sectional view schematically illustrating a wiring structure of the thin film balun 1.

FIGS. 2 to 6 are plan views of wiring layers of the thin film balun 1 illustrated in FIG. 1; FIG. 2 is a plan view of a first wiring layer 10; FIG. 3 is a plan view of a second wiring layer 20; FIG. 4 is a plan view of a third wiring layer 30; FIG. 5 is a plan view of a fourth wiring layer 40; FIG. 6 is a plan view of a fifth wiring layer 50. The first wiring layer 10 is the bottom layer, and the fifth wiring layer 50 is the top layer. FIG. 7 is a cross-sectional view schematically illustrating a wiring structure of the thin film balun 1 illustrated in FIG. 1.

As illustrated in FIGS. 2 to 6, the unbalanced signal terminal 71, ground terminal 72, DC supply terminal 73, balanced signal terminals 74 and 75, and NC terminal 76 are formed in all of the first to fifth wiring layers 10 to 50. The terminals 71 to 76 are electrically connected via through holes P between the different layers. Metal plating is formed in all the through holes P illustrated in FIGS. 2 to 6 so that electrical conduction between the layers is made. The structure of the wiring layers will be described in detail below.

In the first wiring layer 10, as illustrated in FIG. 2, two coils 11 and 12 (a pair of first coil sections) constituting the unbalanced transmission line 2 are formed adjacent to each other. The coils 11 and 12 are equivalent to a ¼ wavelength resonator. An end 11a in the outer side of the coil 11 is connected to the unbalanced signal terminal 71, and an end 11b in the inner side of the coil 11 is connected to a through hole P. An end 12b in the inner side of the coil 12 is connected to a through hole P, and an end 12a in the outer side of the coil 12 is open.

In the second wiring layer 20, as illustrated in FIG. 3, two coils 21 and 22 (a pair of second coil sections) constituting the balanced transmission line 3 are formed adjacent to each other. The coils 21 and 22 are equivalent to a ¼ wavelength resonator. The coils 21 and 22 of the balanced transmission line 3 are disposed to face the coils 11 and 12 of the unbalanced transmission line 2, and the facing parts magnetically couple with each other, thus constituting a coupler. An end 21a in the outer side of the coil 21 is connected to the balanced signal terminal 74, and an end 21b in the inner side of the coil 21 is connected to a through hole P. An end 22a in the outer side of the coil 22 is connected to the balanced signal terminal 75, and an end 22b in the inner side of the coil 22 is connected to a through hole P.

In the third wiring layer 30, as illustrated in FIG. 4, connection wires 31 and 32, and a lower electrode 33 are formed. One end of the connection wire 31 is connected via the through hole P to the end 11b of the coil 11, and the other end of the connection wire 31 is connected via the through hole P to the end 12b of the coil 12. The coils 11 and 12, and the connection wire 31 connecting the coils 11 and 12 constitute the unbalanced transmission line 2.

One end of the connection wire 32 is connected via the through hole P to the end 21b of the coil 21, and the other end of the connection wire 32 is connected via the through hole P to the end 22b of the coil 22. The lower electrode 33 is connected to the connection wire 32, and disposed to overlap a region of the coil 12 in the lower layer. In this way, the lower electrode 33 is connected via the connection wire 32 to the balanced transmission line 3 including the coils 21 and 22. Also, the connection wire 32 and the lower electrode 33 are connected to the DC supply terminal 73.

In the fourth wiring layer 40, as illustrated in FIG. 5, an upper electrode 41 is formed facing the lower electrode 33. The lower electrode 33, upper electrode 41 and an interlayer dielectric film between the lower electrode 33 and upper electrode 41 constitute the capacitor 4. The upper electrode 41 is, similarly to the lower electrode 33, disposed in a region which overlaps the coil 12.

In the fifth wiring layer 50, as illustrated in FIG. 6, a connection wire 51 is formed which connects via a through hole P to the upper electrode 41. Further, the connection wire 51 is connected to the ground terminal 72. Accordingly, the upper electrode 41 of the capacitor 4 and the ground terminal 72 are connected via the connection wire 51.

As illustrated in FIG. 7, the first to fifth wiring layers 10 to 50 are formed on a substrate 60 composed of alumina, for example. The material and manufacturing process of the wiring layers 10 to 50 are not limited, but composed of a material such as Ag, Cu or Al formed by sputtering, CVD, electroplating or electroless plating, for example. Dielectric films 61 to 65 are formed between the wiring layers 10 to 50. The material of the dielectric films 61 to 65 are not particularly limited; but polyimide, photosensitive resin or the like is used for the dielectric films 62, 63 and 65, for example. For the dielectric film 61 between the first wiring layer 10 in which the unbalanced transmission line 2 is formed and the second wiring layer 20 in which the balanced transmission line 3 is formed, silicon nitride, oxide silicon, alumina or the like is used, for example. For the dielectric film 64 between the third wiring layer 30 in which the lower electrode 33 of the capacitor 4 and the fourth wiring layer 40 in which the upper electrode 41 of the capacitor 4 is formed, silicon nitride, oxide silicon, alumina or the like is used, for example.

Figure 8:
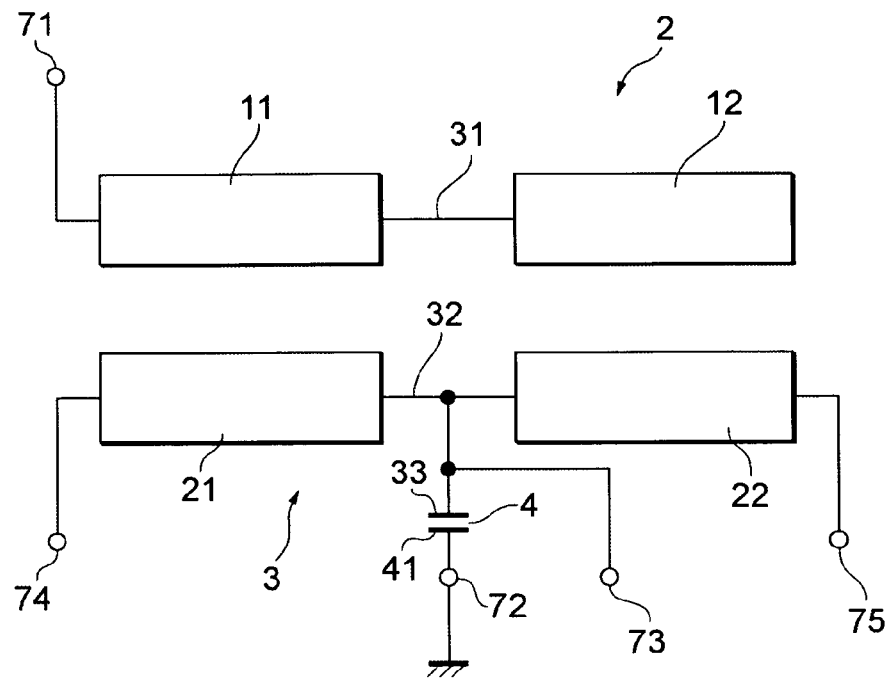
FIG. 8 is an equivalent circuit diagram of the thin film balun 1.

FIG. 8 is an equivalent circuit diagram of the thin film balun 1 illustrated in FIGS. 1 to 7.

As illustrated in FIG. 8, the coil 11, coil 12 and connection wire 31 connecting the coil 11 and coil 12 constitute the unbalanced transmission line 2. One end of the unbalanced transmission line 2 is connected to the unbalanced signal terminal 71, and the other end of the unbalanced transmission line 2 is open. The coil 21, coil 22, connection wire 32 connecting the coil 21 and coil 22 constitute the balanced transmission line 3. For the two coils 21 and 22, one end thereof is connected via the connection wire 32 and capacitor 4 to the ground terminal 72, and the other end thereof is connected to the balanced signal terminal 74, 75.

The operation of the thin film balun 1 will be described with reference to FIG. 8.

In the thin film balun 1, when an unbalanced signal is inputted to the unbalanced signal terminal 71, the unbalanced signal is transmitted in the coil 11, connection wire 31 and coil 21. And as a result of magnetic coupling between the coil 11 and coil 21 and magnetic coupling between the coil 12 and coil 22, the unbalanced signal is converted to two balanced signals having a phase different 180° from each other, and the two balanced signals are outputted from the balanced signal terminals 74 and 75. In this case, a bias voltage is applied to the DC supply terminal 73, so that the balanced signal is amplified before being outputted. Here, the operation of converting a balanced signal to an unbalanced signal is an inverse operation of the above operation.

The characteristics of the balun are evaluated based on the transmission characteristics at the intended frequency and the signal balancing. For the signal balancing, when the difference of phase between the two balanced signals is close to 180° and the difference of amplitude between the two balanced signals is small, the signal balancing is determined to be high. While some points are still not clear with respect to details of operation mechanism, the present inventors have found that the arrangement of the bias supply capacitor affects the balun characteristics.

The arrangement of the capacitor 4 suitable for improving the balun characteristics will be described with reference to FIG. 9. Here, the arrangement region of the lower electrode 33 illustrated in FIG. 9 corresponds to the arrangement region of the upper electrode 41 disposed to face the lower electrode 33, and further to the arrangement region of the capacitor 4.

As described above, the coils 11 and 12 of the unbalanced transmission line 2 and the coils 21 and 22 of the balanced transmission line 3 are magnetically coupled, whereby unbalanced-to-balanced signal conversion is performed. When current flows in the coils, there occurs a magnetic field which runs vertically through a pair of coil openings C1 and C2 defined by the coils 11 and 12 and the coils 21 and 22. Thus effects exerted on the magnetic field are preferably minimized.

Accordingly, it is most preferable to arrange the capacitor 4 so that the capacitor 4 does not entirely overlap the coil openings C1 and C2. As a result, the magnetic flux running through the coil openings C1 and C2 is not blocked by the capacitor 4, so it is estimated that the effects of the capacitor 4 on the magnetic field are significantly reduced.

It is more preferable to arrange the capacitor 4 in a region Ar which overlaps the coils 11 and 12 of the unbalanced transmission line 2. As a result, the thin film balun can be miniaturized as compared to when the capacitor is arranged outside the balanced transmission line 3 so that the capacitor is prevented from overlapping the coil openings C1 and C2.

In this case, preferably the capacitor 4 is disposed particularly at a corner (8 sections in FIG. 9) of the coils 11 and 12 constituting the unbalanced transmission line 2. When the capacitor 4 is disposed in the region Ar which overlaps the unbalanced transmission line 2, also, it is estimated that satisfactory characteristics of thin film balun are provided. In addition, when the capacitor is disposed at a corner, wiring is made easier. The reason for this is that, since the totally eight corners of the two coils 21 and 22 constituting the balanced transmission line 3 are positioned close to the six terminals 71 to 76, when the arrangement of the ground terminal is changed, also, wiring is made more easy. For example, when the NC terminal 76 is used as the ground terminal, the capacitor may be disposed at two corners of the coil 11 or 12 in the central part of the device.

Meanwhile, when the capacitor 4 is disposed to overlap a part of the coil openings C1 and C2, it is preferable to dispose the capacitor 4 so that the regions overlapping the two coil openings C1 and C2 have the same area. In this way, in the case where the capacitor 4 is disposed to overlap the coil openings C1 and C2, when the regions overlapping the two coil openings C1 and C2 have the same area, it is expected that the effects on magnetic field of the left and right coils 21 and 22 are uniformized as compared to when the capacitor overlaps only one of the two coil openings. As a result, it is estimated that the balancing between the two balanced signals outputted from the balanced transmission line 3 increases.

It is more preferable to dispose the capacitor 4 so that the region overlapping one coil opening C1 and the region overlapping the other coil opening C2 are symmetrical with respect to a virtual line which divides the two coil openings C1 and C2. In this way, when the capacitor is disposed so that the regions overlapping the two coil regions are symmetrical, it is expected that the effects on magnetic field of the left and right coils 21 and 22 are uniformized as compared to when the areas of the regions are simply equalized.

Also, from the following result of evaluating the embodiments, it was found that, even when the capacitor is disposed not to equally overlap the two coil openings C1 and C2, if the capacitor is disposed so that a part of the coil opening is exposed, the thin film balun characteristics are improved as compared to when the capacitor is formed over the whole area.

EXAMPLES OF EMBODIMENTS

From a viewpoint of overlapping the coil openings C1 and C2, Examples 1 to 4 in which the arrangement of the capacitor 4 is changed, and Comparative example 1 was prepared.

Figure 10:
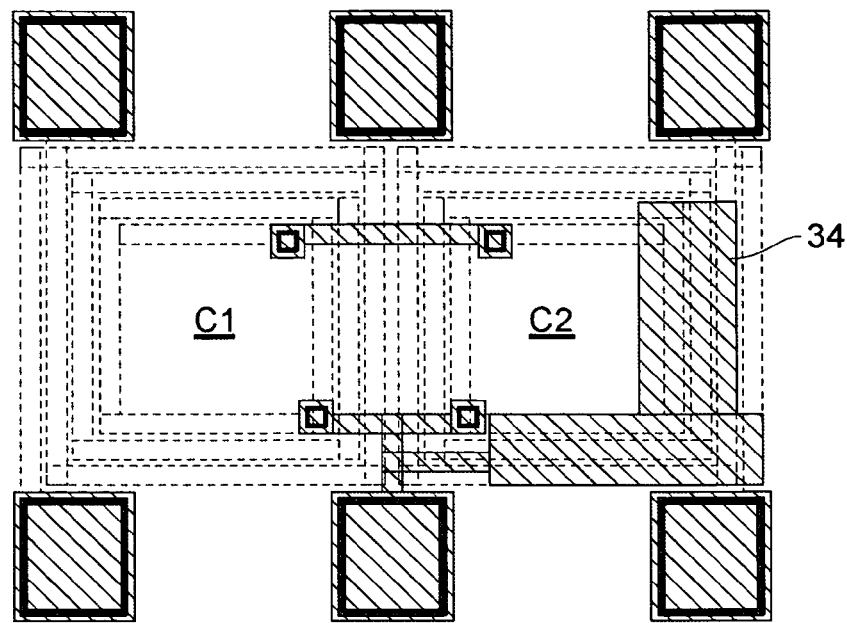
FIG. 10 is a plan view illustrating a lower electrode of the capacitor in the thin film balun 1 according to Example 2.
Figure 11:
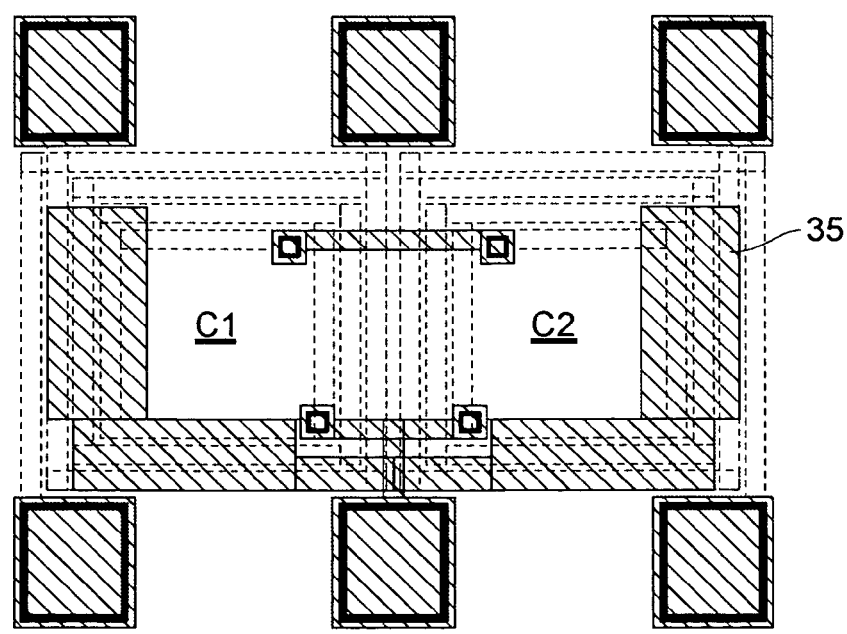
FIG. 11 is a plan view illustrating a lower electrode of the capacitor in the thin film balun 1 according to Example 3.
Figure 12:
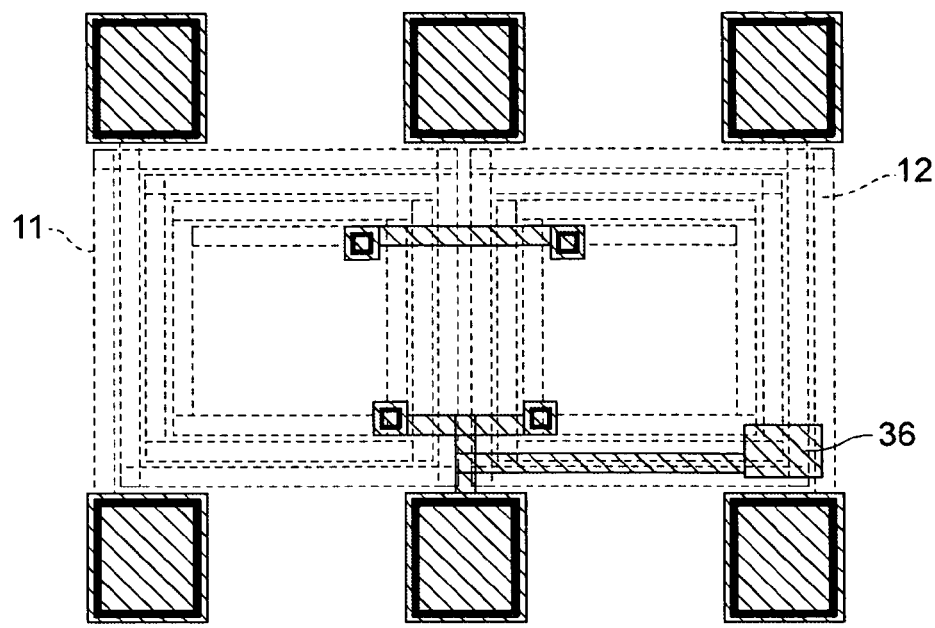
FIG. 12 is a plan view illustrating a lower electrode of the capacitor in the thin film balun 1 according to Example 4.
Figure 13:
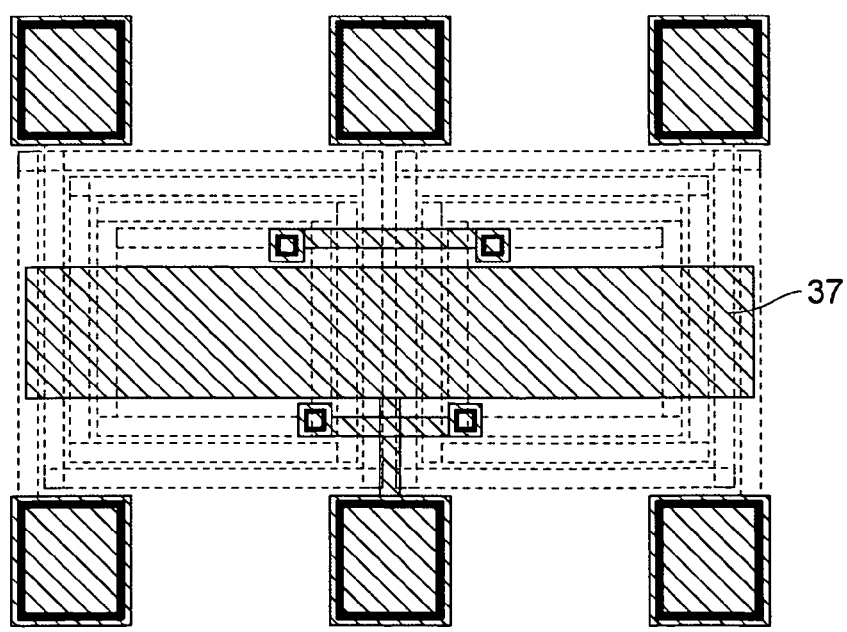
FIG. 13 is a plan view illustrating a lower electrode of the capacitor in the thin film balun 1 according to a comparative example.

FIGS. 10 to 12 are a plan view illustrating the lower electrode of the capacitor of the thin film balun 1 in examples 2 to 4; and FIG. 13 is a plan view illustrating the lower electrode of the capacitor of the thin film balun 1 in the comparative example. Here, the arrangement regions of the lower electrode illustrated in FIGS. 10 to 13 correspond to the arrangement region of the upper electrode disposed to face the lower electrode, and further to the arrangement region of the capacitor. The capacitor arrangement according to the above examples and the comparative example will be described below.

Example 1

Figure 9:
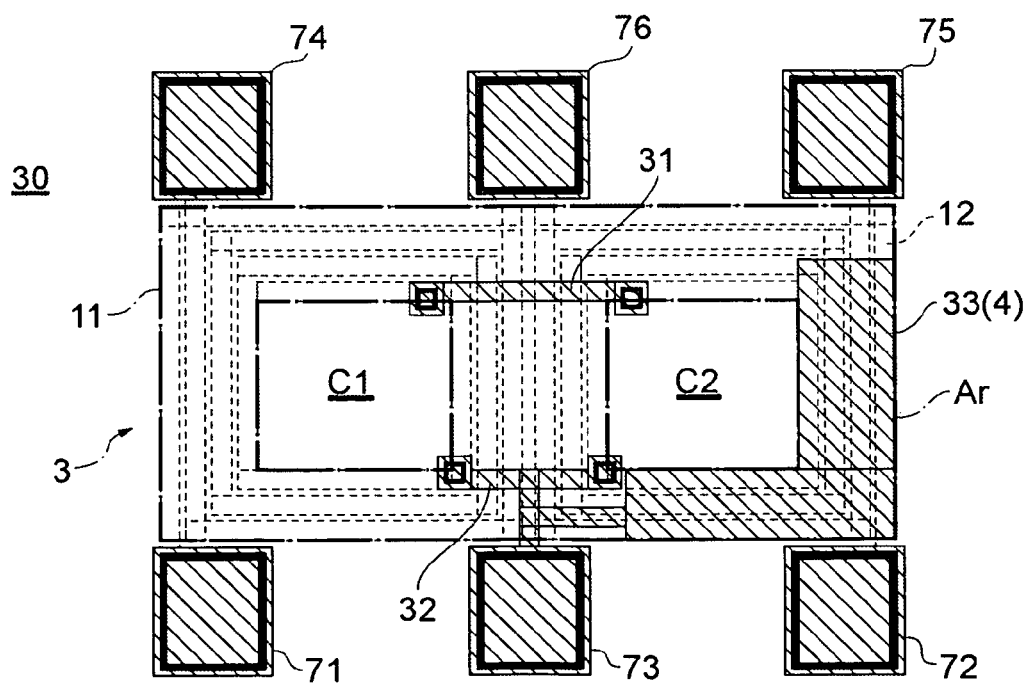
FIG. 9 is a view for explaining a preferred arrangement region of a capacitor.

In the thin film balun 1 of Example 1, as illustrated in FIG. 9, a reverse L-shaped lower electrode 33 of the capacitor 4 is disposed in the region Ar overlapping the coils 11 and 12 of the unbalanced transmission line 2.

Example 2

In the thin film balun 1 of Example 2, as illustrated in FIG. 10, a lower electrode 34 of the capacitor 4 is disposed so that the capacitor 4 overlaps only one coil opening C2 by ¼ the area of that coil opening.

Example 3

In the thin film balun 1 of Example 3, as illustrated in FIG. 11, a lower electrode 35 of the capacitor 4 is disposed so that the regions overlapping the two coil openings C1 and C2 have the same area. Here, the capacitor 4 overlaps the coil openings C1 and C2 by ¼ the area of those coil openings. Further, the capacitor 4 is disposed to be symmetrical with respect to a virtual line which divides the two coil openings.

Example 4

In the thin film balun 1 of Example 4, as illustrated in FIG. 12, a lower electrode 36 of the capacitor 4 is disposed at a corner of the coil 12.

Comparative Example 1

In the thin film balun 1 of Comparative example 1, as illustrated in FIG. 13, a lower electrode 37 of the capacitor 4 is disposed to overlap the whole area of the two coil openings C1 and C2.
(Evaluation Result)
For the structures according to the examples 1 to 4 and Comparative example, the output balancing between two balanced signals was calculated by simulation. The intended frequency was set to 2,400 to 2,500 MHz. In the following evaluation, the acceptance criterion of output balancing was set to −1.2 dB to 1.2 dB.

Figure 14:
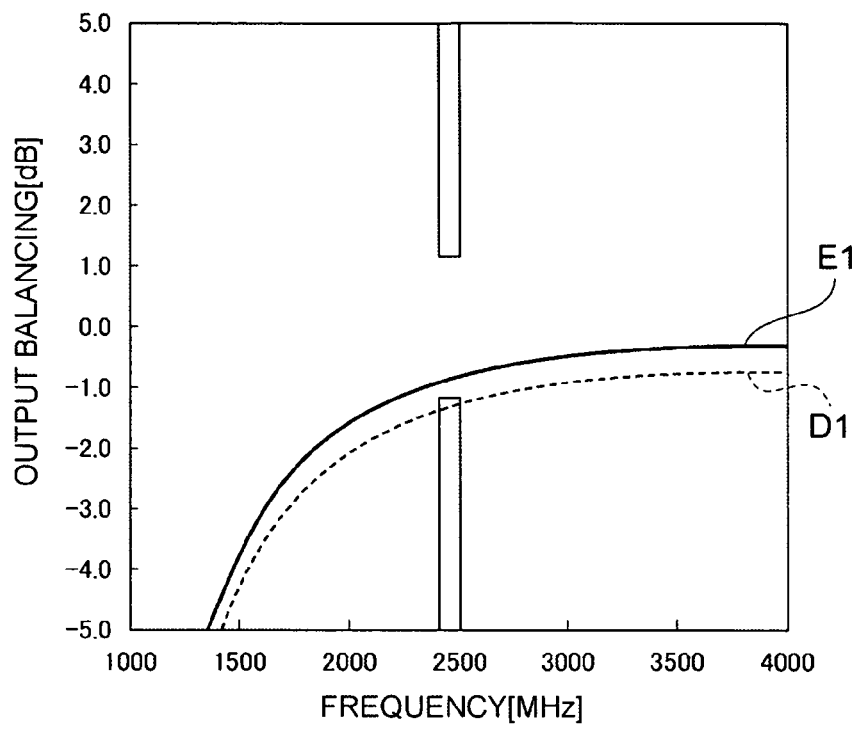
FIG. 14 is a view illustrating a result of comparing the output balancing of Example 1 with that of Comparative example 1.

FIG. 14 is a view illustrating a result of comparing the output balancing of Example 1 (indicated by E1 in FIG. 14) with that of Comparative example 1 (indicated by D1 in FIG. 14). As illustrated in FIG. 14, it was found that: the criterion is not satisfied in the comparative example where the capacitor 4 is disposed in the whole area; but the criterion is satisfied in Example 1 where the capacitor 4 is disposed in the region Ar of the coils 11 and 12.

Figure 15:
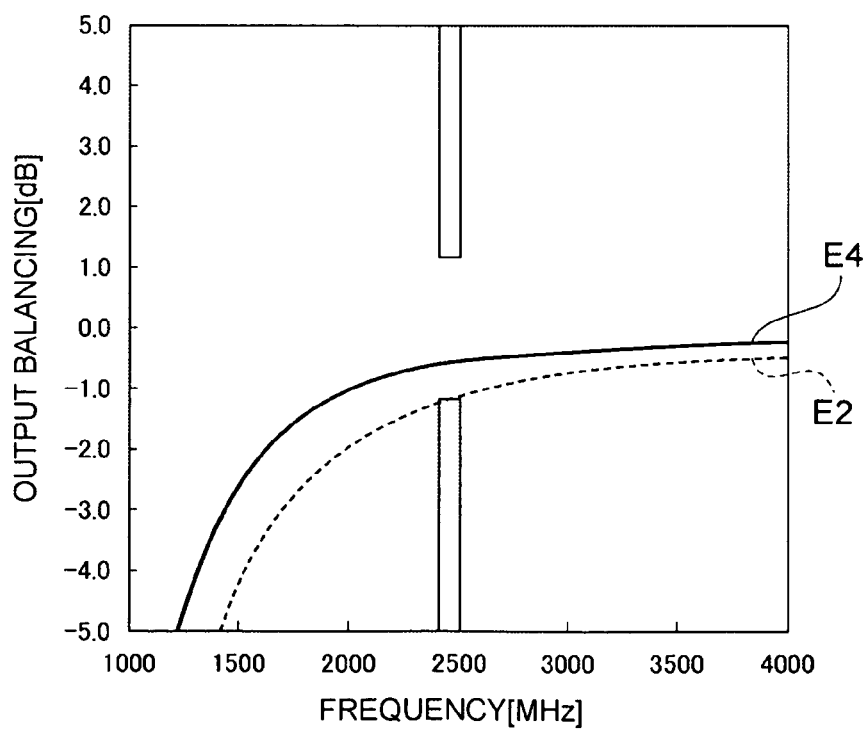
FIG. 15 is a view illustrating a result of comparing the output balancing of Example 2 with that of Example 4.

FIG. 15 is a view illustrating a result of comparing the output balancing of Example 2 (indicated by E2 in FIG. 15) with that of Example 4 (indicated by E4 in FIG. 15). As illustrated in FIG. 15, in Example 2 where only one coil opening is overlapped ¼ the area thereof, it was found that the criterion is satisfied, and the characteristics are improved as compared to Comparative example 1. Particularly, in Example 4 where the capacitor 4 is disposed at a corner of the coil, it was found that the criterion is sufficiently satisfied, and the characteristics of the balun are significantly improved.

Figure 16:
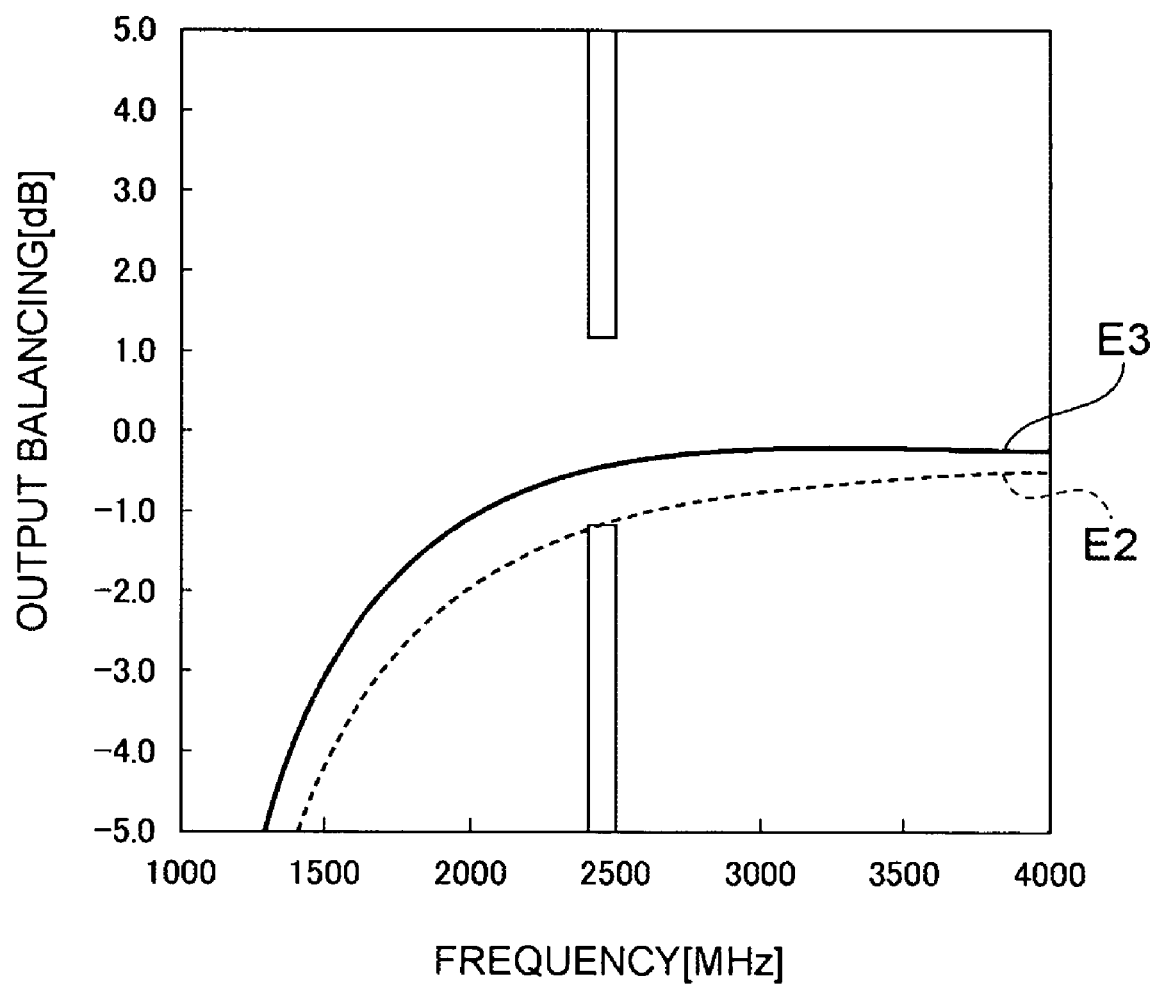
FIG. 16 is a view illustrating a result of comparing the output balancing of Example 2 with that of Example 3.

FIG. 16 is a view illustrating a result of comparing the output balancing of Example 2 (indicated by E2 in FIG. 16) with that of Example 3 (indicated by E3 in FIG. 16). As illustrated in FIG. 16, in Example 3 where the two coil openings are overlapped ¼ the area thereof, it was found that the output balancing is improved as compared to Example 2 where only one coil opening is overlapped ¼ the area thereof.

From the above evaluation result, it was found that the capacitor arrangement according to the present embodiment allows improvement in characteristics of the thin film balun 1.

As described above, the present invention is not limited to the embodiments described above, and many modifications to the embodiments are possible without departing from the gist of the invention. For example, the arrangement of the terminals 71 to 76 is not limited; for example, the NC terminal 76 can be used as the ground terminal. The number of wiring layers constituting the thin film balun 1 may be smaller than five, or six or more. Further, the same effect is achieved in a structure having the exact opposite layer composition, such as an example where the capacitor is formed in the lowermost layer, and the unbalanced electrode in the uppermost layer. Further, the coil arrangement is not limited; for example, a thin film balun structure may be used in which the four coils 11, 12, 21 and 22 of the unbalanced transmission line 2 and balanced transmission line 3 are all stacked, and only one coil opening is defined.

The thin film balun according to the present invention, which allows improvement in characteristics of the thin film balun with a bias supply capacitor, can be used particularly in radio communication apparatuses requiring miniaturization.

What is claimed is:
1. A thin film balun comprising:
an unbalanced transmission line which includes a pair of first coil sections;
a balanced transmission line which includes a pair of second coil sections and which magnetically couples with the unbalanced transmission line;
a capacitor having one end connected to the balanced transmission line; and
a ground terminal connected to the other end of the capacitor,
wherein the capacitor is disposed to have a region which does not overlap a part of a coil opening defined by the first coil section and the second coil section, and
the capacitor is disposed to overlap a part of a region above the first coil section and the second coil section.
2. The thin film balun according to claim 1, wherein the capacitor is disposed not to overlap the whole area of the coil opening.
3. The thin film balun according to claim 1,
wherein the first coil section and the second coil section each have a corner, and
wherein the capacitor is disposed to overlap a part of a region above the corner.
4. The thin film balun according to claim 1,
wherein the pair of first coil sections are disposed adjacent to each other on the same plane, and the pair of second coil sections are disposed to face the pair of first coil sections, and wherein a pair of coil openings disposed adjacent to each other on a plane are defined by the first coil section and the second coil section.

5. The thin film balun according to claim 4,
wherein the capacitor is disposed so that a region overlapping one coil opening of the pair of coil openings has the same area as a region overlapping the other coil opening of the pair of coil openings.

6. The thin film balun according to claim 4,
wherein the capacitor is disposed so that the region overlapping one coil opening and the region overlapping the other coil opening are symmetrical with respect to a virtual line which divides the pair of coil openings into the two coil openings.

* * * * *